US006526079B1

(12) United States Patent
Watterson et al.

(10) Patent No.: US 6,526,079 B1
(45) Date of Patent: Feb. 25, 2003

(54) SINGLE ETALON OPTICAL WAVELENGTH REFERENCE DEVICE

(75) Inventors: Reich Watterson, Lexington, MA (US);
Parviz Tayebati, Boston, MA (US);
Kevin McCallion, Boston, MA (US)

(73) Assignee: CoreTek, Inc., Wilmington, MA (US)

( * ) Notice: Subject to any disclaimer, the term of this patent is extended or adjusted under 35 U.S.C. 154(b) by 0 days.

(21) Appl. No.: 09/636,817

(22) Filed: Aug. 10, 2000

Related U.S. Application Data

(60) Provisional application No. 60/148,017, filed on Aug. 10, 1999.

(51) Int. Cl.[7] .................................................. H01S 3/13
(52) U.S. Cl. ........................................... 372/32; 372/20
(58) Field of Search ........................... 372/20, 29.011, 372/29.02, 32

(56) References Cited

U.S. PATENT DOCUMENTS

| | | | |
|---|---|---|---|
| 4,309,671 A | | 1/1982 | Malyon |
| 4,479,220 A | * | 10/1984 | Bor et al. ................... 372/25 |
| 4,839,614 A | | 6/1989 | Hill et al. |
| 4,914,662 A | | 4/1990 | Nakatani et al. |
| 5,331,651 A | | 7/1994 | Becker et al. |
| 5,438,579 A | | 8/1995 | Eda et al. |
| 5,557,396 A | * | 9/1996 | Ishizuka et al. .......... 356/28.5 |
| 5,691,989 A | * | 11/1997 | Rakuljic et al. ............ 372/20 |
| 5,825,792 A | | 10/1998 | Villeneuve et al. ......... 372/32 |
| 6,198,757 B1 | * | 3/2001 | Broutin et al. .............. 372/32 |
| 6,215,801 B1 | * | 4/2001 | Ackerman et al. .......... 372/32 |
| 6,222,861 B1 | * | 4/2001 | Kuo et al. .................. 372/20 |
| 6,233,263 B1 | * | 5/2001 | Chang-Hasnain et al. ... 372/32 |
| 6,289,028 B1 | * | 9/2001 | Munks et al. ............... 372/20 |

FOREIGN PATENT DOCUMENTS

| | | |
|---|---|---|
| GB | 2 305 773 A | 4/1997 |
| JP | 92-157780 | 5/1992 |

OTHER PUBLICATIONS

EP 0 818 859, Jan. 14, 1998, Bernard et al., H01S 3/133.*

* cited by examiner

Primary Examiner—Paul Ip
Assistant Examiner—Davienne Monbleau
(74) Attorney, Agent, or Firm—Pandiscio & Pandiscio, P.C.

(57) ABSTRACT

A compact wavelength monitoring and control assembly for a narrow band source is provided comprising a narrow bandpass, wavelength selective transmission filter element, of Fabry–Perot structure, through which two collimated beams from a laser source are directed onto two photodetectors. The differential output of the two photodetectors is used in a feedback loop to stabilize the source to the desired wavelength. Through the dependence of the wavelength transmission of the Fabry–Perot etalon on angle and physical parameters, a wavelength variation of the source is converted into a transmission loss, which is different for the detectors, so that the wavelength change is detected by changes in the signals output from the detectors. Through the controlled variation of the source wavelength in the vicinity of the transmission maximum of the etalon, the absolute frequency of the Fabry–Perot locking point may be confirmed by the variation of the ratio of the detector signals.

13 Claims, 3 Drawing Sheets

SINGLE ETALON OPTICAL WAVELENGTH REFERENCE DEVICE

REFERENCE TO PENDING PRIOR PATENT APPLICATION

This patent application claims benefit of pending prior U.S. Provisional Patent Application Ser. No. 60/148,017, filed Aug. 10, 1999 by Reich Watterson et al. for SINGLE ETALON OPTICAL WAVELENGTH REFERENCE DEVICE, which patent application is hereby incorporated herein by reference.

FIELD OF THE INVENTION

This invention relates to wavelength locking of lasers and optical test instruments.

BACKGROUND OF THE INVENTION

Optical fiber communication systems provide for low loss and very high information-carrying capacity. In practice, the bandwidth of optical fiber may be utilized by transmitting many distinct channels simultaneously using different carrier wavelengths. The associated technology is called wavelength division multiplexing ("WDM"). In a narrow bank WDM system, 50 or more different wavelengths are closely spaced to increase fiber transmission capacity.

The wavelength bandwidth that any individual channel occupies depends on a number of factors, including the impressed information bandwidth, and margins to accommodate for carrier frequency drift, carrier frequency uncertainty, and to reduce possible inter-channel cross-talk due to non-ideal filters.

To maximize the number of channels, lasers with stable and precise wavelength control are required to provide narrowly spaced, multiple wavelengths.

Some laser sources, for example vertical cavity surface emitting lasers ("VCSEL's"), exhibit wavelength drift over time, in excess of the requirements for narrow band WDM applications. More particularly, the wavelength of the device tends to change with aging under continuous power. Since telecommunication systems are expected to have a lifetime on the order of 25 years or so, wavelength control must be added to the laser transmitter to ensure minimum cross-talk between narrowly spaced channels over extended time periods.

Single wavelength optical communications systems are widely used in the industry. Ideally, systems designers seek minimum disruption of existing systems, and compatibility with existing packaging, in the development of WDM systems.

Typically, known laser wavelength monitoring and stabilization systems are based on a unit external to the standard package of a laser source (or "transmitter"). One commercially available system for monitoring and control of the wavelength of a semiconductor laser is an assembly based on crystal gratings. For example, in a known system manufactured by Accuwave, and described in the product literature, a wavelength locker unit is provided which comprises a lithium niobate crystal in which two Bragg gratings are written, illuminated by a collimated beam from a laser source coupled to the assembly, and two photodetectors. Each grating has a slightly different Bragg wavelength and angle relative to the input beam. The output reflected from the gratings is directed to the two detectors and the differential output is used to provide feedback control to the laser. Wavelength stability of better than 10 pm can be achieved with the control loop. However, the wavelength locker unit utilizes a separate unit from the transmitter, and thus requires external coupling to the laser or light source. Moreover, the unit is designed for a specific wavelength, as specified by the grating parameters. Different units are required for different wavelengths.

Another known type of wavelength monitoring/control assembly is based on a fiber grating. For example, GB Patent Application No. 96/00478, filed Mar. 4, 1996 by Epworth et al., relates to an external cavity type laser whose external reflector is provided by a Bragg reflector located in an optical fiber butted to an anti-reflection coated facet of the semiconductor laser. The grating is placed far enough from the laser that the longitudinal modes are so closely spaced that the laser operates multimode with so many modes as to make mode partition noise negligible. Another GB Patent Application No. 95/19614.3, filed Sep. 26, 1995 by Epworth et al., relates to using a chirped fiber grating for equalization and laser frequency stabilization.

Fabrication of fiber grating assemblies is complex. As with the crystal grating system mentioned above, fiber gratings are fabricated to match the specific wavelength of the transmitter, and the assembly is therefore wavelength specific.

Another system for stabilization of a semiconductor laser is described in U.S. Pat. No. 4,309,671 to Malyon which uses a pair of matched photodiodes and two beam splitters. The first beam splitter and first photodiode monitor power, and a second beam splitter, a frequency dependent filter and second photodiode are used to monitor wavelength changes. The outputs of the matched photodiodes are fed via amplifiers to a subtractor amplifier and the output is fed as negative feedback to the amplifier controlling operation of the laser.

Other known systems are based on a filter element such as a Fabry-Perot etalon. For example, U.S. Pat. No. 5,331,651 to Becker et al. describes the use of a Fabry-Perot etalon for fine tuning in conjunction with a grating for coarse tuning of the output of a laser.

In a system described in U.S. Pat. No. 5,438,579 to Eda et al., a Fabry-Perot etalon is used with a single photodetector to generate a signal used to lock onto one peak of a semiconductor laser, requiring collimated beams. Hill et al., in U.S. Pat. No. 4,839,614, describe a system for referencing frequencies of radiation from multiple sources relative to a reference source, using a filter element such as a Fabry-Perot etalon and a corresponding plurality of detectors.

Another system for laser wavelength stabilization is described in U.S. Pat. No 4,914,662 to Nakatani et al. which involves spectroscopically processing the output of a variable wavelength laser and measuring a spatial distribution using image processing apparatus, and then comparing the distribution to that of a reference light source of fixed wavelength. The latter image processing system is complex, and not readily compatible with providing a low cost, compact unit.

Japanese Patent Application No. 92-157780 relates to a frequency stabilizer for a semiconductor laser, without using external modulating means, and is based on an inclined Fabry-Perot etalon on which the laser source is incident, and two photodetectors to detect, respectively, the transmitted and reflected signals. By subtracting outputs of the two detectors, a signal is provided for controlling the oscillation frequency. Resonator length is altered by changing the inclination of the etalon to allow for tunability. The implementation of this system for minimum space requires using the F-P (i.e., the Fabry-Perot etalon) at a relatively large angle, with decreased stability in terms of center wavelength and bandwidth. On the other hand, a small F-P angle requires added components and space, as shown in FIG. 1B of the aforementioned Japanese patent application. Also, independent detectors are used, with potentially different response and aging characteristics.

The system described in U.S. Pat. No. 5,825,792 to Villeneuve et al. uses a differential technique along with a Fabry-Perot etalon to stabilize a laser. The system of U.S. Pat. No. 5,825,792 has some similarities to the present invention; however, the system of U.S. Pat. No. 5,825,792 does not provide an independent absolute wavelength determination capability and could be difficult to implement in WDM systems with a very large number of channels, such as 40 or 80 channels.

Consequently, various existing systems for wavelength stabilization are known using a crystal grating, fiber grating or etalon based arrangement. The grating based systems lack wavelength tunability, and many systems are based on relatively large control units external to a packaged laser source with concurrent coupling, space and power dissipation problems. While etalon based systems provide tunability, none of the known configurations are sufficiently compact to incorporate in known standard packages without disruption.

OBJECTS OF THE INVENTION

The primary object of this invention is to provide a temperature stable wavelength reference device in a low cost compact device. Multiple wavelength (or, alternatively, frequency) references, located at previously defined absolute locations, are generated. Two signals generated simultaneously by passing collimated light through a single etalon at two properly chosen, distinct angles provides the information needed for absolute frequency determination at any one of a large number of frequencies spaced on an evenly spaced frequency (i.e., ITU) grid.

SUMMARY OF THE INVENTION

The present invention provides a compact wavelength monitoring and control assembly, preferably for integration within a small semiconductor laser package and for application in WDM optical transmission systems.

Thus, according to one aspect of the present invention, there is provided a wavelength monitoring and control assembly for an optical system comprising a divergent laser emission source, the assembly comprising;

first and second photodetectors spaced apart by a specific separation, and located at a specific distance from the emission source;

a narrow bandpass wavelength selective transmission filter element, of Fabry-Perot structure, located between the source and the detectors;

a phase grating plate, to split an incident collimated optical beam into two or more beams with a predetermined angular relationship, located between the filter element and the source;

a collimating lens located between the phase grating and the source; and a control loop for feedback of a control signal, which is generated as a function of the difference and ratio of the signals generated by the first and second photodetectors in response to a change in wavelength of the emission source, to a control means of the emission source; a table stored in the controller contains the information required to select the required ratio after the target wavelength is known.

Optionally, an external computer system (e.g. a personal computer or systems control device) may be used to select or change the desired wavelength.

Thus, a simple and compact wavelength monitoring and control assembly with an internal absolute wavelength reference for a laser emission source is provided. Because the transmission of a Fabry-Perot filter is characterized by a series of transmissive peaks at regular frequency intervals, for example, at 100 GHz spacing, simultaneous stabilization points are attainable for a plurality of predetermined wavelengths which are determined by the wavelength spacings on the multiple transmissive peaks of the Fabry-Perot filter. The photodetectors are illuminated by beams passing through a narrow bandpass filter at different angles of optical incidence. Thus, wavelength variation of the laser emission source is converted into different photocurrent changes in the two photodetectors. The wavelength variation of the ratio of the two photocurrents is used to identify the particular transmissive peak, and thus the approximate absolute frequency, of the Fabry-Perot filter. The wavelength variation of the difference of the two photocurrents is used simultaneously in a feedback loop to stabilize the wavelength of the source to a desired target wavelength, i.e. through a signal sent back to the laser (transmitter), e.g. via a wavelength tuning voltage, or active area temperature, or current changes, to correct for wavelength drift.

This assembly allows for precise optical monitoring of the wavelength to provide a control signal for wavelength stabilization, to maintain the laser wavelength within the limits required to reduce cross-talk for use in, for example, a WDM optical transmission system. A difference signal is advantageous also to provide immunity to fluctuations in source output power.

The narrow bandpass wavelength selective transmission filter element is a Fabry-Perot structure. The photodetectors are preferably a matched pair of photodiodes. Through the angular dependence of the wavelength transmission of the Fabry-Perot etalon, a wavelength variation from the source is converted to a transmission loss, and the wavelength change is detected as a power change. Thus, the device functions as an optical wavelength discriminator in which the detector converts optical energy to current for a feedback loop for controlling the light source. For determination of the approximate absolute wavelength, the ratio of the two photocurrents is used to identify the Fabry-Perot order. For wavelength stabilization, the differential output of the two photodetectors is used in a feedback loop to stabilize the wavelength of the laser source to a desired target wavelength.

Beneficially, the angle of inclination of the filter is adjustable to provide tunability of the predetermined wavelengths. Since the wavelength selective element is a Fabry-Perot etalon, whose transmission characteristics are dependant on the angle of the etalon relative to the beam, the assembly provides for the tunability needed to remove the effects of fabrication and assembly tolerances by adjusting the angle of the etalon.

The assembly is simple to manufacture relative to fabrication of fiber grating systems for wavelength stabilization. This approach provides a dither free discrimination scheme, which avoids frequency modulation and demodulation steps.

Advantageously, the photodetectors are a matched pair of photodiodes. When the gain of each of the two photodetectors is independently adjustable, the predetermined wavelengths may be selected by setting the unequal gain for the two photodetectors.

Optionally, a lens is disposed between the transmissive filter element and the photodetectors to a maximize the power falling on the two detectors and to optimize the separation of the two optical beams. A larger beam diameter passing through the transmissive filter element is preferable to provide a more nearly ideal filter shape to obtain more optimum wavelength selective performance.

The laser emissive source may be an output from a VCSEL, an output facet from a semiconductor laser, or alternatively a cleaved or tapered single mode fiber.

Advantageously, when the laser emission source comprises a laser (semiconductor or VCSEL) provided within a package, the wavelength monitoring assembly is provided within the same package to provide an integral unit. While use of the assembly as an external reference unit is feasible, polarization maintaining fibers and couplers are ideally required to avoid polarization dependence.

Because the monitoring assembly is simple and compact, an important advantage is that the assembly may be co-packaged with the laser source in a transmitter module. Additionally, a single such module may be used as a source at any one of a large number of predetermined wavelengths. This is particularly useful in adapting existing transmitter modules, as used for multi-wavelength transmission systems, for use with additional components for WDM without taking up additional space and with minimum disruption of existing systems.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

Figure 1:
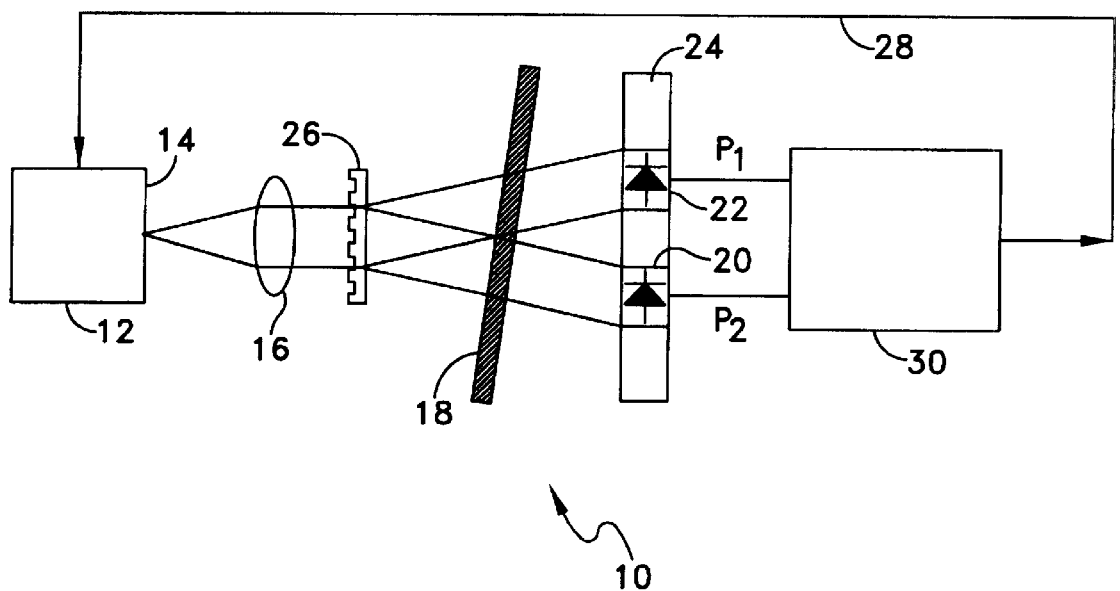
FIG. 1. shows an optical layout; light is input to the device via an optical fiber and collimation device, or it may be extracted directly from a laser; the light then passes through a beam splitter/deviation device (for example, this device may be an optical phase plate or an optical wedge prism); the two collimated beams then pass through the etalon at slightly different angles of incidence—the different angles of incidence lead to different free spectral range values for the two beams as they pass through the same etalon; finally, the two beams are directed onto two separate detectors—the electrical signals produced by the detectors are then used by the controlling electronic circuit to locate and lock to known frequencies.

Looking first at FIG. 1, there is shown a wavelength monitoring assembly 10 which comprises one embodiment of the present invention. The assembly comprises a divergent source 12 of laser emission, e.g., the output of a VCSEL 14 or, alternatively, an output facet of a semiconductor laser source or an output facet of a single mode fiber ("SMF"). A lens 16 provides for collimation of the output beam of the laser source, which is directed to phase grating 26. The phase grating 26 is preferably a plate having a thickness or refractive index variation which varies across, or within, the plate so as to impose a periodic optical phase retardation transverse to the optical beam. Such a phase plate will produce secondary optical beams at angles which are positive and negative multiples of $\Theta_{diffract} = \lambda_{laser}/\lambda_{grating}$. The relative magnitude of the diffracted beams is controlled by the magnitude of the maximum phase retardation. The multiple output beams are directed to a narrow-bandpass, wavelength selective transmission filter element 18. Filter element 18 is preferably a Fabry-Perot ("F-P") resonator, which is a structure comprising a spacer layer sandwiched between two highly reflecting layers. It is constructed, for example, as a multilayer single cavity filter type, where an all-dielectric mirror/spacer/mirror structure is deposited on a glass substrate. Alternatively, a solid etalon type may be used, in which mirrors are deposited on both sides of a glass spacer plate.

The transmitted beams are directed onto first and second similar coplanar photodetectors ($P_1$) 22 and ($P_2$) 20 having a specific diameter and separation on a common support 24 at a specific distance from the F-P etalon 18, as shown schematically in FIG. 1. A controller 30 processes the two detector signals $P_1$ and $P_2$ and controls and stabilizes the laser wavelength via a feedback loop 28.

Since the wavelength of the light source determines how much of the beam is transmitted by the F-P filter 18, the signal received at each detector 22 and 20 is dependent on the wavelength emitted from the light source. Thus, through the angular dependence of the wavelength transmission of the Fabry-Perot etalon 18, a wavelength variation from the source is converted to a transmission change, and the wavelength change is detected as a power change by the two photodetectors. The output signals from the two, photodetectors are used to generate both a difference signal and a ratio signal. The difference and ratio signals may be generated by either analog circuits (e.g., a difference amplifier or analog ratio circuit) or by a digital signal processor ("DSP") which may calculate the difference and ratio values of the signals output from $P_1$ and $P_2$ after being converted to a digital data stream by a suitable analog to digital ("AD") circuit. The maximum of the ratio of the output signals output from $P_1$ and $P_2$, measured as the wavelength of the laser source is varied, will determine the order of the Fabry-Perot etalon and thus the wavelength to within one free spectral range which is the frequency difference between adjacent transmissive peaks of the Fabry-Perot etalon. A table of such values of the ratio of the signals output from $P_1$ and $P_2$ for each desired target wavelength is stored within the DSP controller. When the controller detects that the ratio of signals output from $P_1$, and $P_2$ corresponds to the target wavelength, then the difference in signals output from $P_1$ and $P_2$ is used to generate a difference signal. Such difference signal may be generated by a difference amplifier or within the DSP. The difference signal is fed to a feedback loop for controlling the output wavelength of the laser source. The transmission detected by both detectors will be arranged to be equal at any of the multiple target wavelengths, the difference signal will thus be set to zero at the multiple target (i.e., locked) wavelengths. The locked wavelengths can be set to different values in the vicinity of the equal transmissive wavelength by using unequal gains for photodetectors $P_1$ and $P_2$. If the source wavelength changes, the differential signal generated by the two detectors, i.e. the error signal, is wavelength dependent and can be used to monitor the wavelength of the light source. The device functions therefore as an optical wavelength discriminator in which the photodetectors convert optical energy to a current for a feedback loop for controlling the source.

Figure 2:
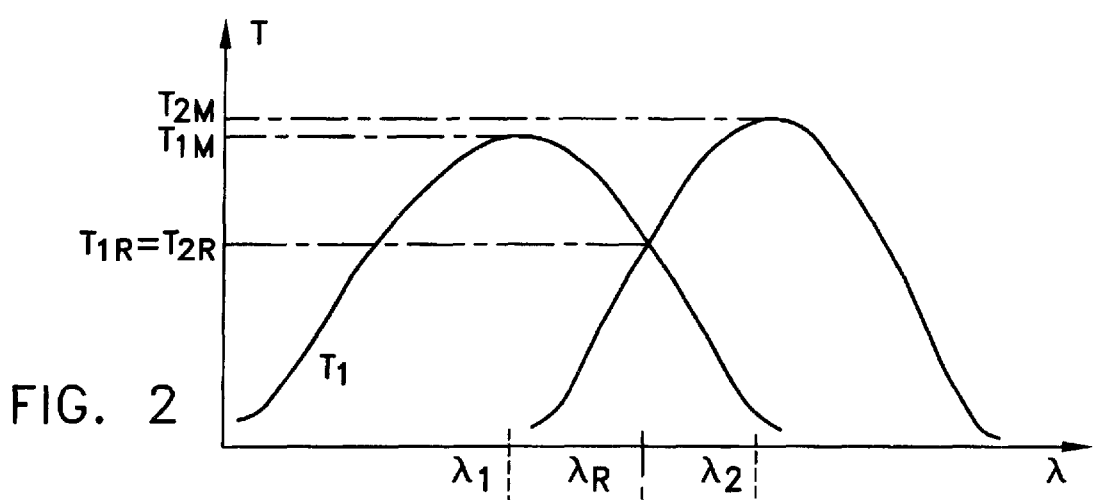
FIG. 2 shows the transmission curves of the etalon for the signals as the wavelength is varied in the vicinity of one locking point where the two transmission curves cross.
Figure 3:
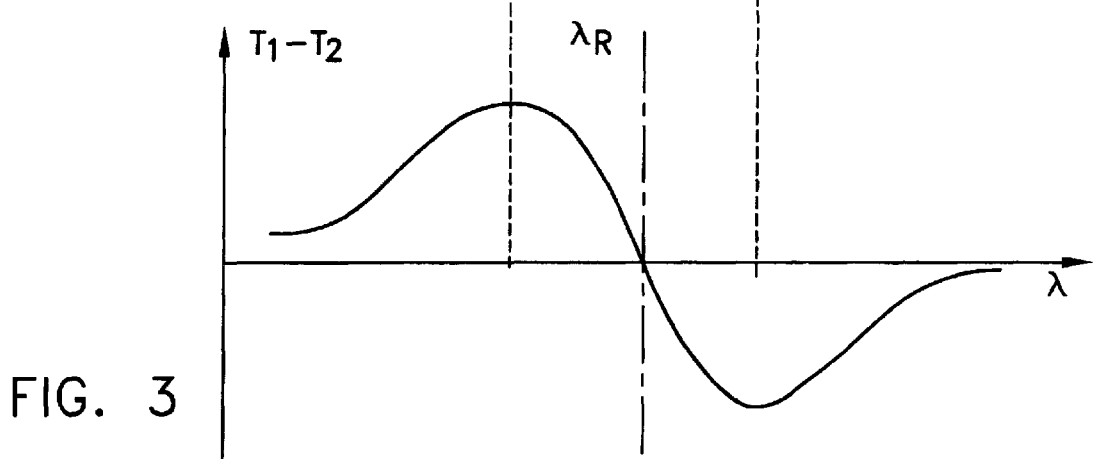
FIG. 3 shows the difference signal generated by the difference of the two detector signals as the wavelength is varied in the vicinity of one Fabry-Perot order.
Figure 4:
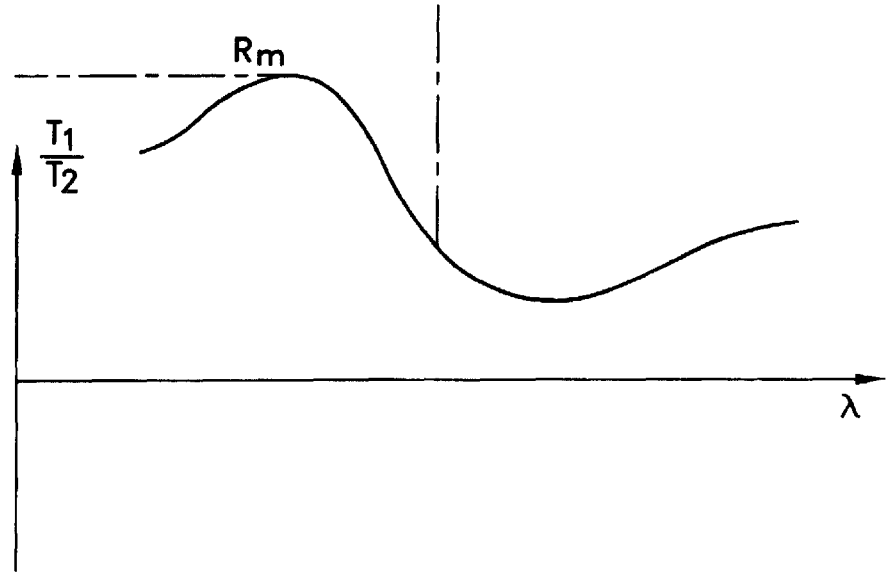
FIG. 4 shows the ratio signal generated by the ratio of the two detector signals as the wavelength is varied in the vicinity of one Fabry-Perot order; the ratio of the peak transmission of detector 1 to the signal detected at the same wavelength in detector 2 identifies the absolute wavelength.

Schematic representations of the transmissive curves, ratio signal generated by the two detectors and the difference signal generated by the two detectors are shown respectively in FIGS. 2, 3, and 4.

FIG. 2 shows the transmission curves of the two detectors, where T is the transmission from source to detectors, where $T_1$ and $T_2$ represent the transmission curves for the individual detectors $P_1$ and $P_2$, with maximum transmission at $T_{1N}$ and $T_{2N}$ at $\lambda_1$ and $\lambda_2$.

The difference in signals $T_1-T_2$ is shown in FIG. 3 where the locking wavelength is denoted by $\lambda_R$.

The ratio of the signals from the two detectors is shown in FIG. 4 where $R_M$ is the maximum value of the signal ratio. For particular choices of parameters, the value attained by the ratio may be used to denote the approximate frequency. The maximum ratio value is obtained at a wavelength offset from the target, locking wavelength where the ratio is unity for all of the multiple possible target wavelengths.

Figure 5:
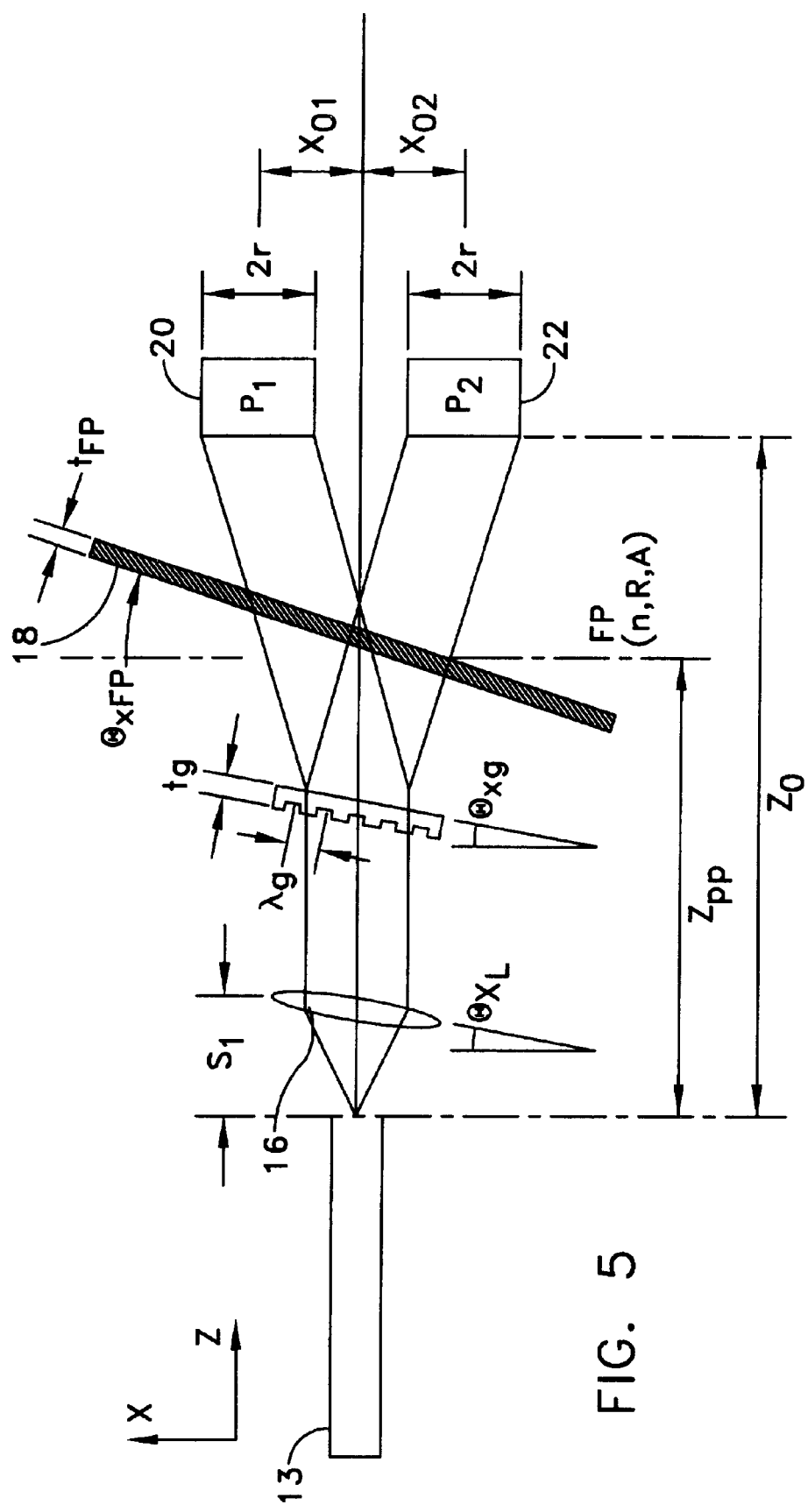
FIG. 5 shows a schematic of part of the assembly similar to that shown in FIG. 1, which defines coordinates and parameters for design of the assembly.

FIG. 5 defines coordinates and a number of relevant configuration parameters for an assembly including a divergent emission source (e.g., a single mode fiber) lens, phase grating, filter and pair of photodetectors.

As shown in FIG. 5, the divergent source 13 has a generally Gaussian pattern, which may be elliptical (laser) or circular (single mode fiber).

The grating phase plate has parameters of thickness $t_g$, refractive index $n_g$, phase modulation period $\lambda_g$, phase modulation depth $\Delta\Phi$, and x-axis tilt angle $\Theta_{xg}$. The y-axis tilt angle $\Theta_{yg}$ may be arbitrarily chosen to be zero. The angle between the first diffracted beams $\Theta_{beam}$ is given by $\lambda_{source}/\lambda_g$, thus selection of the phase modulation period allows selection of the angular relationship between the beams which are directed to the Fabry-Perot narrow band filter 18.

The Fabry-Perot etalon has parameters of thickness $t_{FP}$, refractive index $n_o$, reflectivity R, internal transmission A, and x-axis tilt angle $\Theta_{xFP}$ (which is nominally zero but which may be made non-zero to correct for fabrication of assembly tolerances). The y-axis tilt angle $\Theta_{yFP}$ may be arbitrarily chosen to be zero. The two detectors have nominal y-axis positions $y_{P1}$ and $y_{P2}$, which are arbitrarily set equal to zero.

Other configuration parameters are chosen in accordance with these parameters and the desired specifications, i.e., the combination of the desired transmission curves and the desired change in transmission curves for the different orders of the Fabry-Perot etalon. These other configuration parameters include: the focal length of the lens f, z axis position $S_1$, x-axis tilt angle $\Theta_{xFP}$ and $\Theta_{xg}$ of the Fabry-Perot etalon and phase grating, respectively, the z-axis position of the etalon $Z_{FP}$ and, assuming that the detectors are circular, the diameters 2 r of the photodetectors, their z axis position $z_0$ and x axis positions $x_{01}$ and $x_{02}$.

The pair of detectors are coplanar, and separated center to center by a distance $x_{01}+x_{02}$, and located a distance $Z_0$ from the light source. The FP filter is tilted at an angle $\Theta_{FP}$, and the phase grating is tilted at an angle $\Theta_g$ from the normal to the plane of the two detectors.

Factors influencing the performance of the assembly include the FP tilt angle in the x and y axis, the FP index change with temperature, refractive index dispersion in the FP, the detector x and y axis offset, lens position and tilt, and the detector z axis position. T is the transmission from the source to a detector and includes the coupling loss due to limited detector size.

The range and spacing of the desired locked wavelengths have specific values, e.g. 1560.20 nm to 1528.38 nm with a channel spacing of 50 GHz (approximately 0.4 nm, requiring 80 separate channels). The two F-P transmission curves shown in FIG. 2 correspond to the situation at the longest wavelength (e.g., 1560.20 nm) of the desired wavelength range and are symmetrically displaced by $\Delta f$ (in frequency units) from the first desired locking point which is defined by the intersection of the two F-P transmission curves. An integer order number is selected such that the F-P free spectral range (FSR) of the transmission curve, which is centered at a frequency higher than the intersection point, corresponds to a FSR value which is less than the channel spacing (e.g., 50 GHz). A second integer order number is selected such that the F-P FSR of the transmission curve, which is centered at a frequency below the intersection point, is greater than the channel spacing. The combination of $\Delta f$ and order numbers must be chosen such that the two distinct FSR values are symmetrically displaced about the channel spacing (e.g., 50 GHz). The number of orders required for the two transmission curves to interchange their locations with respect to the intersection point may be calculated from $\Delta f$ and the initial offset value to confirm that sufficient distinct channels are available. The angle required between the two beams illuminating the F-P etalon is found from the ratio of the two FSR values and the well-known characteristics of F-P etalons. The required finesse (and thus the etalon mirror reflectivity) is found by selecting practical limits on the F-P transmission in the vicinity of the maximum detector signal ratio (for example, 0.76 and 0.24). As the source wavelength is tuned to shorter wavelengths (e.g., to higher frequency), the two F-P transmission curves will move towards each and eventually interchange places from order to order. The crossing point will remain centered on the average FSR (i.e., 50 Ghz) in order to maintain proper channel location with respect to WDM requirements. The maximum ratio of detector signals in the vicinity of each order will change in a monotonic manner. Thus finding the maximum detector signal ratio in the vicinity of a F-P order will uniquely identify that order and thus the absolute frequency of the locked wavelength defined by the crossing point of the two transmissive curves.

The assembly may be fine tuned in wavelength by changing the angle of inclination of the filter $\Theta_{FP}$ and/or the phase grating $\Theta_g$ by mounting on an adjustable support with four degrees of freedom, including angular adjustment. Once the assembly is aligned to the proper wavelength and FSR values, the components (including the lens, phase grating and the filter) are fixed in place using thin layers of adhesive or laser welding techniques.

Thus, the minimum required components for the wavelength discrimination scheme are a lens, a phase grating, a narrow band transmission filter (etalon), two closely spaced detectors (preferably a matched pair of photodiodes) and a control loop which responds to both the ratio and the difference of the signals from the two photodetectors. A Fabry-Perot etalon is required to provide the required characteristics of the wavelength selective filter element.

The light source may, for example, be a VCSEL or the front facet of a semiconductor laser, or the cleaved or tapered end of a single mode fiber. The divergence of the emission source is controlled by a lens as shown in FIG. 1, which may be any suitable aspherical lens, a cylindrical lens, a spherical lens, and a graded index lens of glass or plastic. A larger spot size permits achievement of more ideal F-P filter shape, a higher F-P finesse value if needed (e.g., for a large number of channels) and optimizes power transfer to the detectors.

In the assembly described above, the compactness and simplicity of the configuration allows for co-packaging with a laser source in a laser transmitter package. This is a particular advantage for integration with existing systems.

Thus a simple and compact wavelength monitoring and control assembly for a laser source is provided comprising a phase grating, wavelength selective transmission filter element (for example, a Fabry-Perot etalon), through which near-collimated beams from the laser source are directed onto two closely spaced photodetectors. For wavelength determination the ratio of the outputs from the photodetectors is used in combination with a stored table of absolute wavelength as a function of maximum photodetector signal ratio. For wavelength stabilization, the differential output of the two photodetectors generated by the change in transmission of the filter element with a change in wavelength is used in a feedback loop to stabilize the wavelength of the laser source to any one of a predetermined array of wavelengths on a uniformly spaced grid.

Advantages of the Invention

Numerous advantages are achieved through the use of the present invention.

For one thing, the present invention provides a compact device to generate both a comb of reference frequencies and to provide an absolute frequency reference.

And the present invention comprises a single etalon, lower cost device.

Furthermore, the present invention provides a thermally stable wavelength reference, since compact size permits packaging within a thermally controlled laser package.

Modifications

Various modifications may be made to the perferred embodiment described above without departing from the present invention.

For example, splitting and deviation may be performed using optical wedges or mirros.

And/or splitting and deviation may be performed using folded optical paths rather than in the manner shown in FIG. 1.

Furthermore, the phase grating plate may have a phase delay function which is sinusoidal in the transfer coordinate, or of a periodic functional form optimized to diffract light into particular grating orders (blazed).

While specific embodiments have been described in detail, it will be understood that variations and modifications of the embodiments may be made within the scope of the following claims.

What is claimed is:

1. A wavelength monitoring and control assembly for an optical system comprising a laser emission source for generating a divergent beam, the assembly comprising:
   first and second photodetectors spaced apart by a specific distance from the emission source;
   a lens to collimate the emission from the emission source located between the source and photodetectors;
   a phase grating located between the lens and the photodetectors, the phase grating being constructed so as to produce two or more diffracted beams with a specific angular relationship;
   a narrow bandpass wavelength selective transmission filter element of Fabry-Perot structure located between the phase grating and the photodetectors, the filter element being tilted at an angle $\Theta$ relative to the optical axis of the emission source to provide an angular dependence of the wavelength transmission of the filter, for illuminating the photodetectors with different beams diffracted by the phase grating, incident at the filter at different angles, and transmitted by the filter, whereby a change in wavelength from the source is converted to a difference in transmission detected by the photodetectors, the design parameters of the transmission filter being chosen in combination with the design parameters of the phase grating so as to produce transmission orders which lie in a specific relationship to the desired locking wavelength, wherein the relationship of the transmission orders with respect to the locking wavelength is designed to be unique for different wavelengths in the wavelength range of use;
   a first control loop for evaluation of the ratio of the signals generated by the first and second photodetectors in response to a change in wavelength of the emission source, wherein the first control loop is adapted to provide a feedback ratio signal to the emission source to provide wavelength selection of the source; and
   a second control loop for feedback of a difference signal generated by the first and second photodetectors in response to a change in wavelength of the emission source to the emission source to provide wavelength stabilization of the source at a wavelength selected by the first control loop.

2. An assembly according to claim 1 comprising a phase grating of binary phase retardation profile.

3. An assembly according to claim 1 comprising a phase grating of sinusoidal phase retardation profile.

4. An assembly according to claim 1 comprising a phase grating of blazed periodic retardation profile.

5. A system comprising:
   a laser emission source; and
   a wavelength monitoring and control assembly for an optical system comprising a laser emission source for generating a divergent beam, the assembly comprising:
   first and second photodetectors spaced apart by a specific distance from the emission source;
   a lens to collimate the emission from the emission source located between the source and photodetectors;
   a phase grating located between the lens and the photodetectors, the phase grating being constructed so as to produce two or more diffracted beams with a specific angular relationship;
   a narrow bandpass wavelength selective transmission filter element of Fabry-Perot structure located between the phase grating and the photodetectors, the filter element being tilted at an angle $\Theta$ relative to the optical axis of the emission source to provide an angular dependence of the wavelength transmission of the filter, for illuminating the photodetectors with different beams diffracted by the phase grating, incident at the filter at different angles, and transmitted by the filter, whereby a change in wavelength from the source is converted to a difference in transmission detected by the photodetectors, the design parameters of the transmission filter being chosen in combination with the design parameters of the phase grating so as to produce transmission orders which lie in a specific relationship to the desired locking wavelength, wherein the relationship of the transmission orders with respect to the locking wavelength is designed to be unique for different wavelengths in the wavelength range of use;

a first control loop for evaluation of the ratio of the signals generated by the first and second photodetectors in response to a change in wavelength of the emission source, wherein the first control loop is adapted to provide a ratio feedback signal to the emission source to provide wavelength selection of the source; and a second control loop for feedback of a difference signal generated by the first and second photodetectors in response to a change in wavelength of the emission source to the emission source to provide wavelength stabilization of the source at a wavelength selected by the first control loop.

6. A system according to claim 5 wherein said source is a VCSEL.

7. A system according to claim 5 wherein said source is an output facet of a semiconductor laser.

8. A system according to claim 5 wherein said source is a cleaved single mode fiber.

9. A system according to claim 5 wherein said source is a tapered single mode fiber.

10. A system according to claim 5 further comprising means to adjust the angle of said narrow bandpass wavelength selective transmission filter element so as to provide wavelength tunability.

11. A system according to claim 1 wherein said photodetectors are matched.

12. A system according to claim 1 wherein said photodetectors have independently adjustable gain, and further wherein the locking wavelength is selectable by setting unequal gains.

13. A system according to claim 1 wherein simultaneous stabilization points are attainable by multiple transmissive peaks characteristic of the Fabry-Perot filter, and further wherein the multiple peaks are uniquely identified by characteristics of the variation in photodetector signals in the vicinity of the peaks.

* * * * *